United States Patent [19]

Faith, Jr.

[11] 4,440,799

[45] Apr. 3, 1984

[54] MONITOR FOR IMPURITY LEVELS IN ALUMINUM DEPOSITION

[75] Inventor: Thomas J. Faith, Jr., Lawrenceville, N.J.

[73] Assignee: RCA Corporation, New York, N.Y.

[21] Appl. No.: 435,971

[22] Filed: Oct. 22, 1982

[51] Int. Cl.³ .............................................. H01L 21/24
[52] U.S. Cl. .......................................... 427/8; 427/90; 427/91; 29/574
[58] Field of Search .................. 427/8, 90, 91; 29/574

[56] References Cited

FOREIGN PATENT DOCUMENTS 2090057  6/1982  United Kingdom .................. 29/574

OTHER PUBLICATIONS

Fang et al., *Solid-State Electronics*, vol. 22, pp. 933-938, (1979).
McNeil, *J. Electrochem. Soc.*, vol. 116, No. 9, pp. 1311-1312, (1969).
Ghate, *Thin Solid Films*, vol. 83, pp. 195-205, (1981).
Berger, *Journal of the Electrochem. Soc.*, vol. 119, No. 4, pp. 507-514.
Ting et al., *Solid-State Electronics*, vol. 14, pp. 433-438, (1971).
Chang, *J. Electrochem. Soc.*, vol. 117, No. 3, pp. 368-372, (1970).

*Primary Examiner*—John D. Smith
*Assistant Examiner*—James J. Seidleck
*Attorney, Agent, or Firm*—Birgit E. Morris; R. Hain Swope

[57] ABSTRACT

A method of monitoring the contact resistance in a film of an aluminum-based metal deposited on a silicon substrate in a vacuum chamber is provided wherein a reference wafer containing contact resistance measurement circuits is utilized. A significant number of contact resistance measurements is utilized to determine the impurity level in the film and/or to predict the post alloy contact resistance distribution from pre-alloy values.

9 Claims, 6 Drawing Figures

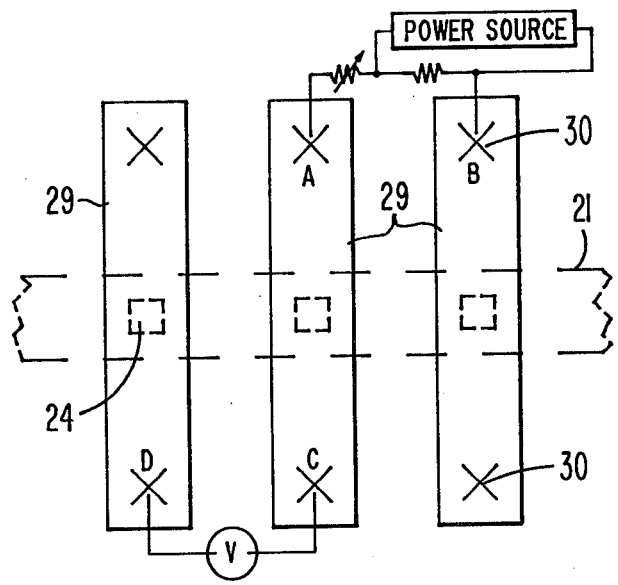
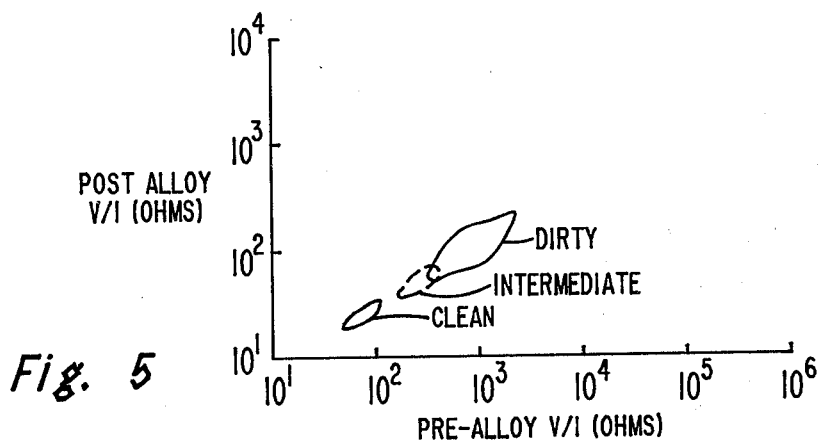
Fig. 5
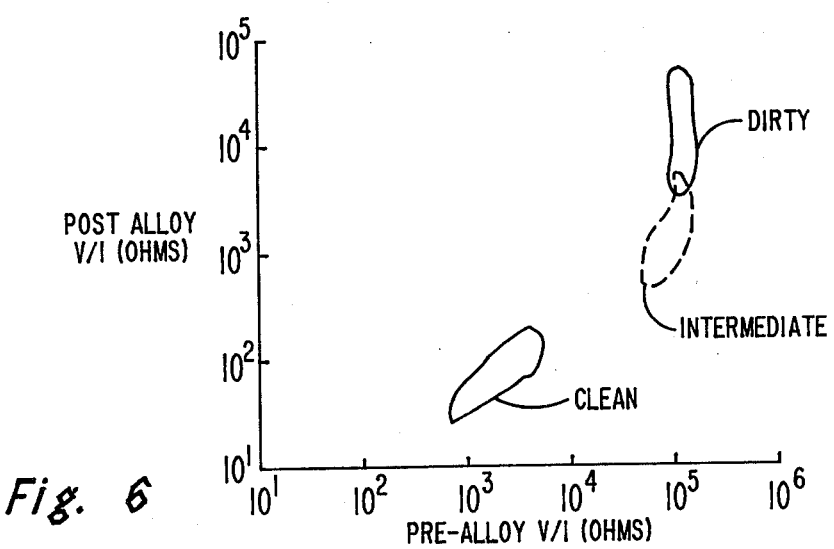
Fig. 6

MONITOR FOR IMPURITY LEVELS IN ALUMINUM DEPOSITION

This invention relates to the vacuum deposition of aluminum films. More particularly, this invention relates to a method of determining the acceptability of aluminum to silicon contacts.

BACKGROUND OF THE INVENTION

Metallization of various substrates, particularly silicon, with aluminum-based metals such as aluminum, Al-Si alloys, Al-Cu-Si alloys, and the like is commonplace in the manufacture of integrated circuits. Such metallizations are typically deposited in magnetron sputtering systems. Because aluminum is a reactive metal, impurity atoms and molecules in the vacuum chamber, particularly oxygen and water vapor, tend to react with and become part of the growing film. Even small concentrations of such impurities can influence properties of the film such as grain size, hardness, stress, resistivity and the like. Changes in these properties can, in turn, affect film adhesion to the substrate, etchability, contact resistance to device silicon, bondability and the like. Significant changes in these and other functional characteristics have frequently been noted in such films although there was no discernible change in the deposition conditions.

For example, an air leak of $10^{-3}$ torr-liters per second might cause a slight increase in pumpdown time, but would not prevent the chamber from reaching a base pressure of $10^{-6}$ torr. Throttling and backfilling with argon would immediately swamp out this pressure. However, such an air leak would result in an oxygen content of about one percent in an aluminum film, causing significant changes in film properties.

A wafer substrate for such metal depositions is usually covered by an oxide layer in which there are numerous small holes which expose the underlying silicon. The exposed silicon must have good contact, i.e. low resistance, with the overlying metallization in order for the circuit to function properly. This requires that the contact holes be well etched, the silicon surface be clean and the vacuum system be free of leaks and relatively free of impurities.

In the manufacture of large scale integrated circuits (LSICs) and very large scale integrated circuits (VLSICs), the metal deposition step is one of the last in the fabrication process sequence. Therefore, a considerable loss, both in time and material, will be incurred if metal deposition is not carried out properly.

Presently, contact integrity is tested only after the metal coating has been patterned and alloyed to improve the metal-to-silicon contact. Once patterning and alloying have been carried out, it is virtually impossible to strip the metal and repeat the metallization procedure. Therefore, when the conventionally used test shows poor metallization, a wafer lot must be discarded. In accordance with this invention, there is provided a means of accurately determining the contact resistance distribution of the aluminum-to-silicon contacts and thereby predicting the acceptability of the finished alloyed product. The subject method affords a determination immediately after metal deposition, and prior to the alloying step, while stripping of the metal and remetallization are still possible.

SUMMARY OF THE INVENTION

The present invention utilizes a monitor wafer to determine whether the contact between an aluminum-based film deposited in a vacuum chamber and the silicon substrate is acceptable. The monitor wafer provides measurements of contact resistance in predetermined areas in a region of high conductivity in the reference silicon wafer where there is direct contact with the aluminum-based film. The statistical distribution of a plurality of such measurements accurately indicates the contact resistance of the aluminum-to-silicon contact immdiately after deposition. The accurate determination of contact resistance, in turn, provides a basis for predicting the post-alloy acceptability of the contact or the impurity level of the metal film as deposited.

BRIEF DESCRIPTION OF THE DRAWINGS

FIG. 4 is a schematic top view of a single contact-resistance measurement circuit on the monitor wafer illustrated in FIG. 3.

FIG. 5 is a plot of 34 contact resistance (voltage/current or V/I) determinations on each of three monitor wafers upon which aluminum was deposited under "clean", "intermediate" and "dirty" conditions. The determinations were made pre- and post-alloying to illustrate the prediction capability of the present method. In each instance, all determinations for each condition are contained in each envelope curve.

FIG. 6 is a plot of the same determinations as were expressed in FIG. 5 made on a different deposition system than that used in FIG. 5.

DETAILED DESCRIPTION OF THE INVENTION

The subject method of monitoring the impurity level in an aluminum-based film deposited in a vacuum chamber involves the use of a monitor wafer which contains a plurality of test sites. A test site, in essence, comprises a region of high conductivity in the wafer appropriately masked so that the overlying aluminum-based film contacts the region only in predetermined areas, referred to as "contact cuts".

Figure 1:
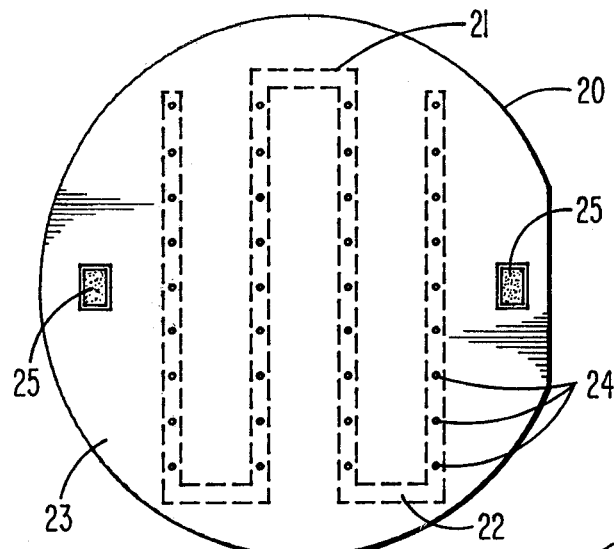
FIG. 1 is a top view of a monitor wafer useful in the method of this invention, illustrated prior to metal deposition.

A typical monitor wafer in accordance with this invention is illustrated, before metal deposition, in FIG. 1.

In FIG. 1, the wafer 20, which is of p-type silicon, has a thin oxide coating thereon. A predetermined region or channel 21 is photolithographically defined in the oxide layer. This region is then heavily doped n+ type by either diffusion or ion implantation. Ion implantation is preferred for the production of large numbers of monitor wafers in view of its superior reproducibility. The methodology and dopants utilized are considered to be well within the skill of the art.

Once the channel 21 has been doped, the wafer is re-oxidized to form a layer of silicon dioxide thereover. Therefore, the oxide layer 22 in the channel 21 is thinner than the oxide layer 23 on the remainder of the wafer. The wafer is then suitably masked and contact cuts 24 are photolithographically defined therein by conventional procedures. Alignment keys 25 are likewise defined in the oxide layer 23. Removing the oxide in contact cuts 24 permits direct contact between the metal to be deposited and the doped channel 21 only at those cuts.

After the removal of the oxide in contact cuts 24, predetermined portions of the wafer are coated with an aluminum-based film in a vacuum deposition system. The portions coated with the aluminum-based film include the contact cuts 24. The metal film can be deposited to cover predetermined portions of the wafer by any conventional method such as coating over the entire wafer and then lithographically pattern etching to form the desired contact areas. It is preferred, however, that the metal be deposited through a mask such as illustrated in FIG. 2.

Figure 2:
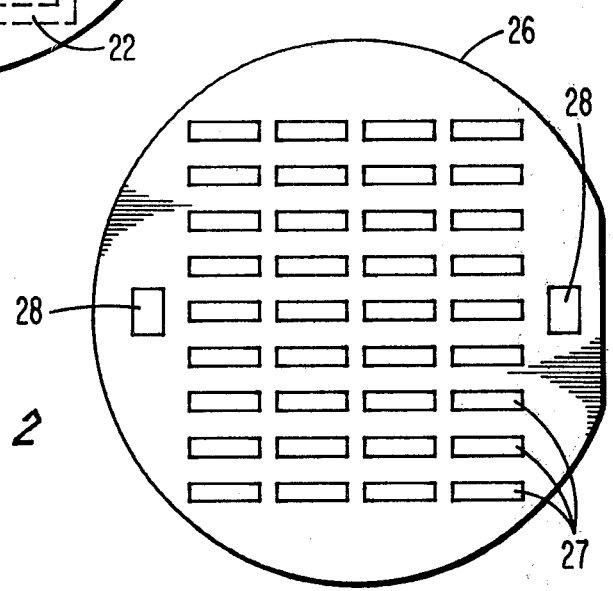
FIG. 2 is a top view of a mask which may be utilized to provide the metal deposition pattern on the monitor wafer illustrated in FIG. 1.

In FIG. 2, the mask 26 has the same configuration as the monitor wafer 20. The mask contains openings 27 in a configuration such that metal deposition will overlie each contact cut 24. Alignment holes 28 conform to alignment keys 25 in the wafer 20.

Figure 3:
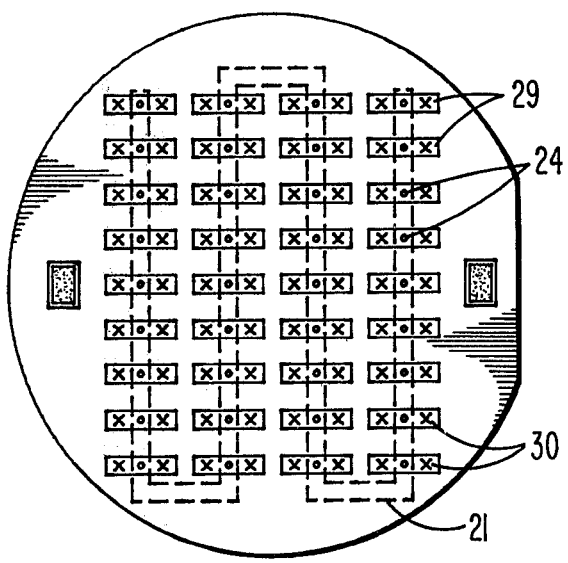
FIG. 3 is a top view of the subject monitor wafer after metal deposition illustrating the probe positions for the subject determinations.

FIG. 3 illustrates the monitor wafer after metal deposition. In use, the masked wafer will be placed in the deposition chamber with production devices, e.g. silicon substrates for LSI or VLSI devices, while the latter are undergoing metallization. After metal deposition is completed, the monitor wafer is withdrawn from the deposition chamber and the determinations of contact resistance are made at contact cuts 24 which will indicate the acceptability of the metal-to-silicon contacts in the production devices. In FIG. 3, areas of aluminum film 29 have been deposited so as to cover each contact cut 24 over conductive channel 21. The points at which probes will be connected to each aluminum area are indicated by the Xs 30. There are two probe points 30 for each area 29 of metal deposited on the wafer. Each pair of probe points 30 is situated so that the channel 21 and, therefore, the contact cut 24, is between them. A single measurement circuit on the wafer shown in FIG. 3 is schematically illustrated in FIG. 4.

In FIG. 4, a test circuit is illustrated involving any three contact cuts 24 along channel 21. The three aluminum rectangles 29 which make contact with the silicon at the three contact cuts 24 constitute a pattern of three Kelvin pairs. In the monitor measurement, a current is passed through the conductive channel 21 between the probe points 30 labeled "A" and "B" from a constant current power source. The voltage is measured by probes at points "C" and "D". Aside from a small spreading resistance in the region near contact cut 24, the only current carrying resistive element in loop C-D is the contact interface at the common contact cut, i.e. the contact cut between probe points A and C. Therefore, the voltage is substantially equal to the voltage drop across the metal/silicon interface at common contact cut A-C. If the contact is ohmic, the ratio voltage to current, V/I, is equal to the resistance at contact cut A-C. Before alloying, however, the contacts are often rectifying rather than ohmic. Therefore, care must be taken to measure all circuits at the same current and polarity. This current should be low enough to avoid electrical breakdown at the contact interface.

It is preferred in accordance with this invention that a monitor wafer contain as many contact resistance measurements sites as possible, the number of such sites being limited only by available space on the wafer. It will also be appreciated that the particular reference circuit shown in FIGS. 1-4 is given for purposes of illustration only and other arrangements accomplishing the same result could likewise be utilized in practicing the invention. It will likewise be appreciated in viewing FIGS. 1-4 that only 34 measurements can be made from the monitor wafer illustrated even though there are 36 contact cuts 24. This is so because, in the measurement circuit illustrated, only the middle or common of three contact cuts can be measured. Therefore, in the wafer illustrated, the contact cuts at the ends of channel 21 could not be measured.

By taking a significant number of such V/I measurements, it is possible in accordance with this invention to predict whether devices such as VLSI circuits will have acceptable aluminum-to-silicon contacts after alloying or to determine the relative level of impurities in a deposition of an aluminum-based film. By significant number of measurements is meant a number which will be statistically meaningful in the context of the test. It will be appreciated by those of ordinary skill in the art that a meaningful number of measurements may decrease over a period of time as one works with a given test. Generally, at least 20 and, preferably, from about 30 to 40 measurements should be made. As a general consideration, the number of measurements may be limited by the geometries of the test site and the size of the wafer. This type of measurement and calculations are know to those of ordinary skill in the art. H. H. Berger describes such measurements on aluminum-silicon contacts in an article in the *Journal of the Electrochemical Society*, Vol. 119, p. 507 (1972). In accordance with this invention, the calculations of Berger have been applied to the problems of predicting post-alloy contact resistance or conveniently detecting the presence of impurities in a vacuum deposition of an aluminum-based metal. Until the present invention, it was not appreciated that the calculations proffered by Berger could be utilized in a sensitive method of predicting such contact resistance or ascertaining minute levels of impurities which are known to cause substantial changes in the effectiveness of such an aluminum-based deposition.

In order to utilize the contact resistance measurements to predict post-alloy contact resistance or determine the relative impurity level in a vacuum deposition of an aluminum-based film in accordance with this invention, the conditions of experimental depositions can be carefully varied to create, as a point of reference, a clean environment, a dirty or contaminated environment and an intermediate or partially contaminated environment. For example, clean conditions approximating those in ideal manufacturing operations are obtained by dipping the wafers, which have been photolithographically patterned to expose the silicon in predetermined regions, in a dilute hydrofluoric acid solution for one minute and immediately inserting them in the vacuum chamber which is pumped down to, e.g. $7.5 \times 10^{-7}$ Torr, before argon backfill. The HF dip removes native oxide from the exposed silicon and the high vacuum removes most of the water vapor and oxygen from the chamber.

Intermediate conditions, which are close to, but fall somewhat short of, ideal manufacturing conditions can be simulated, for example, by dipping the wafers as above and immediately inserting them into the chamber, but only evacuating the chamber to $3 \times 10^{-6}$ Torr, thus leaving more residual gas and water vapor in the system. Thus, the difference between clean and intermediate in this instance is the result of conditions in the vacuum chamber and not the wafer surface.

Dirty conditions, significantly worse than would be expected in typical manufacturing conditions in the electronics industry, can be simulated, for example, by exposing the wafers to air for 18 hours after dipping, and evacuating the chamber as in intermediate conditions. In this instance the difference between intermediate and dirty is the wafer surface as opposed to the chamber conditions. Variations in the means of creating these relative conditions are considered to be within the skill of the art.

The monitor methodology of this invention can be utilized in high vacuum deposition systems conventionally utilized in integrated circuit metallizations; for example, magnetron sputtering systems, electron beam evaporators, evaporators in which the aluminum-based metal is evaporated from heated filaments or from rf heated crucibles and the like. The monitor wafer is placed in conventional manufacturing equipment with product to be metallized. It is, of course, critical to the practical application of the subject method that the monitor wafer receive exactly the same preparation as the substrates to be metallized, e.g. time interval between HF dip and insertion into the vacuum chamber. The aluminum-based metal can include pure aluminum and alloys with, for example, silicon, copper and the like.

The method of monitoring the level of impurities in an aluminum-based film deposited in a vacuum chamber in accordance with this invention is highly advantageous in terms of its ease, convenience and, particularly, reproducibility. More important, the present method is highly sensitive and reliable. In contrast, other potentially useful monitoring methods, e.g. the resistivity of the aluminum-based film, the etch rate thereof and the film specularity, have been found to be unacceptable because they were not sufficiently sensitive and/or not reliable or reproducible.

With regard to the manufacture of devices such as VLSI circuits, the subject methodology provides a basis for deciding immediately after metallization whether to strip the metal, reclean and repeat the deposition or to proceed to alloy the aluminum-silicon contact. The economic benefits realized from being able to accurately predict the acceptability of the aluminum-to-silicon contact post alloy are substantial.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Monitor wafers containing 36 contact-resistance-measurement (CRM) patterns as illustrated in FIGS. 1, 3 and 4 were prepared as follows. The substrates were p-type silicon (100) wafers each of which had a steam grown oxide coating approximately 8000 angstroms thick. The channel 21 and the alignment keys 25 were formed photolithographically in the oxide coating on each wafer. The channel was N+ doped by diffusion at 950° from a phosphorus oxychloride source. The wafers were then reoxidized to cover the doped channel 21 with a layer of oxide approximately 500 angstroms thick.

Contact cuts 24, which measured 3×3 micrometers, were then photolithographically defined in the oxide overlying channel 21. The wafers were then coated with an aluminum-1 percent silicon alloy by magnetron sputtering using an S-Gun, Varian 3120 system, Varian Associates. For a first wafer, the system was pumped down to $7.5 \times 10^{-7}$ Torr before backfilling with argon to a pressure of 3 mtorr. The wafer was dipped in dilute hydrofluoric acid immediately prior to insertion into the vacuum chamber. This wafer represented clean conditions of deposition.

The second wafer was treated in a similar manner except that the system was evacuated to only $5 \times 10^{-6}$ Torr. This wafer resented "intermediate" or "partially contaminated" conditions. A third wafer was allowed to sit for 18 hours after the hydrofluoric acid dip, thus allowing for native oxide growth in the contact cuts. This wafer represented "dirty" conditions in the aluminum-based film.

The metal coatings on the wafers were photolithographically patterned to remove a portion of the aluminum, leaving Kelvin contact pairs 29 transverse to the channel 21, each of which included a contact cut 24 as illustrated in FIG. 3. In a manufacturing situation, photolithographic patterning and etching of the aluminum would not be necessary, as the aluminum would be deposited through an appropriate mask as illustrated in FIG. 2. Through probe points 30, a constant current of 10 microamps was caused to flow through two of each group of three Kelvin contacts and readings were taken on a voltmeter attached to two on the opposite side of the channel as illustrated in FIG. 4. The results of the determination in each instance is a measure of the contact resistance in the common contact cut 24 in each group of three.

The readings were taken for each of 34 groups of three contact cuts in each monitor wafer. The wafers were then heated to 425° for 30 minutes in a forming gas atmosphere to alloy the aluminum-to-silicon bond. The measurements were then repeated on each wafer. The results of both of these determinations are graphically represented in FIG. 5.

In FIG. 5, the advantageous predictability of the subject monitor system is clearly seen by the compact envelopes which encompass both the pre- and post-alloy readings. It is thus shown that the present method affords a basis in a pre-alloy determination of predicting the acceptability of the post-alloy aluminum-to-silicon bond.

EXAMPLE 2

A second group of monitor wafers was prepared as in Example 1 and metallized under similar conditions. The metallization, however, was carried out in a different deposition chamber than that used in Example 1. The results of pre- and post-alloy readings are represented in FIG. 6. It can be seen that, although the envelopes are of approximately the same area as those in FIG. 5, all readings are significantly higher, indicating a higher level of impurities present at the point of measurement. After these determinations were made, the system utilized was carefully inspected and it was found that it had a significant leak. This data further establishes the sensitivity of the monitor wafers of this invention.

COMPARATIVE EXAMPLE

Aluminum films deposited under the conditions described in Example 1 were examined for specularity, resistivity and etch rate, three convenient methods for inferring film purity, in an attempt to differentiate between "clean" and "dirty". Visual examination specularity showed no difference among the three samples. The results of the other tests are reported in the following Table.

TABLE

| Wafer Condition | Etch Rate | Resistivity |
|---|---|---|
| Clean | 7.9 | 4.53 |
| Intermediate | 8.1 | 4.39 |
| Dirty | 7.9 | 4.32 |

The etch rate was in thousands of angstroms per minute and resistivity in microohms-cm. Both etch rate and resistivity should increase clean to dirty. However, because the readings clean vs. dirty are all within the conventional five percent allowance for experimental error, it can only be concluded that none of the methods tested is sufficiently sensitive to be of value in monitoring the impurity level in an aluminum-based film.

I claim:

1. A method of predicting the degree of post-alloy contact resistance between an aluminum-based film deposited in a vacuum chamber and a silicon substrate therefor comprising:
    (a) providing in the chamber a monitor wafer of p-type silicon having a plurality of contact resistance measurement test sites, each test site comprising a region of N+-doped high conductivity such that contact with the film will occur at a plurality of predetermined areas in said region;
    (b) depositing the aluminum-based film on a selected portion of the monitor wafer, said portion including said contact areas and comprising a plurality of Kelvin contacts;
    (c) measuring the contact resistance at said contact areas prior to alloying of said film;
    (d) determining the distribution of contact resistance in the film from a significant number of such measurements; and
    (e) using said determination as an indication of the post-alloy contact resistance.

2. A method in accordance with claim 1, wherein said regions of high conductivity are formed by ion implantation of a suitable dopant into predetermined portions of the monitor wafer.

3. A method in accordance with claim 2, wherein the dopant is phosphorus.

4. A method in accordance with claim 1 wherein said contact areas are formed by removing a predetermined portion of an oxide layer which overlies the conductive region thereby exposing the underlying silicon.

5. A method in accordance with claim 1 wherein a test circuit is formed including said Kelvin contacts and the contact resistance is measured by applying a current across a portion of the region of high conductivity which includes a first and second pair of said Kelvin contacts and measuring the voltage drop across the second and a third pair of Kelvin contacts, wherein said voltage drop is equal to the contact resistance of the contact in said second pair of Kelvin contacts.

6. A method in accordance with claim 1 wherein the degree of contact resistance between said film and the silicon substrate is determined by comparing the contact resistance measurements against values for films having predetermined contact resistance levels.

7. A method in accordance with claim 1, wherein the aluminum-based film is aluminum.

8. A method in accordance with claim 1, wherein the film is an aluminum-silicon alloy.

9. A method in accordance with claim 1, wherein the contact resistance is measured immediately after deposition of the film.

* * * * *